United States Patent
Cheng

(10) Patent No.: US 11,783,743 B2
(45) Date of Patent: Oct. 10, 2023

(54) SHIFTING REGISTER, DRIVING METHOD THEREOF, DRIVING CIRCUIT AND DISPLAY DEVICE

(71) Applicants: Beijing BOE Technology Development Co., Ltd., Beijing (CN); BOE Technology Group Co., Ltd., Beijing (CN)

(72) Inventor: Hongfei Cheng, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/416,459

(22) PCT Filed: Dec. 28, 2020

(86) PCT No.: PCT/CN2020/140309
§ 371 (c)(1),
(2) Date: Jun. 18, 2021

(87) PCT Pub. No.: WO2021/164424
PCT Pub. Date: Aug. 26, 2021

(65) Prior Publication Data
US 2022/0406234 A1    Dec. 22, 2022

(30) Foreign Application Priority Data
Feb. 19, 2020    (CN) .......................... 202010105859.4

(51) Int. Cl.
*G09G 3/20* (2006.01)
*G09G 3/3266* (2016.01)
(Continued)

(52) U.S. Cl.
CPC ............. *G09G 3/20* (2013.01); *G09G 3/3266* (2013.01); *G09G 3/3677* (2013.01); *G11C 19/28* (2013.01);
(Continued)

(58) Field of Classification Search
CPC .. G11C 19/28; G09G 2310/0286; G09G 3/20; G09G 3/3266; G09G 3/3677; G09G 2310/0267
See application file for complete search history.

(56) References Cited

U.S. PATENT DOCUMENTS

2016/0125955 A1    5/2016    Pang
2016/0351160 A1    12/2016    In et al.
(Continued)

FOREIGN PATENT DOCUMENTS

CN    103280196 A    9/2013
CN    104299590 A    1/2015
(Continued)

OTHER PUBLICATIONS

CN202010105859.4 First Office Action.
CN202010105859.4 Decision of Rejection.

*Primary Examiner* — Xuemei Zheng
(74) *Attorney, Agent, or Firm* — IPRO, PLLC

(57) ABSTRACT

A shifting register, a driving method thereof, a driving circuit and a display device are provided. The shifting register includes a control circuit (10), a first output circuit (20), a second output circuit (30) and a first switching transistor (T1). Shifting output of signals may be realized through interaction of all of the circuits. Moreover, an influence of a leak current on a signal of a second end of the first switching transistor is reduced by setting the first switching transistor (T1) to isolate the second output circuit (30) and a second node (N2).

14 Claims, 6 Drawing Sheets

(51) Int. Cl.
*G09G 3/36* (2006.01)
*G11C 19/28* (2006.01)

(52) U.S. Cl.
CPC .............. *G09G 2310/0267* (2013.01); *G09G 2310/0286* (2013.01)

(56) References Cited

U.S. PATENT DOCUMENTS

| | | |
|---|---|---|
| 2017/0278450 A1 | 9/2017 | Ma |
| 2017/0316751 A1 | 11/2017 | Wang |
| 2020/0020291 A1 | 1/2020 | Huang |
| 2020/0029291 A1* | 1/2020 | Siomina ............ H04W 56/0045 |
| 2020/0294461 A1* | 9/2020 | Xu ....................... G09G 3/3677 |

FOREIGN PATENT DOCUMENTS

| | | | | |
|---|---|---|---|---|
| CN | 104795106 A | | 7/2015 | |
| CN | 104900268 A | | 9/2015 | |
| CN | 105185339 A | | 12/2015 | |
| CN | 105741802 A | | 7/2016 | |
| CN | 106782399 A | | 5/2017 | |
| CN | 107039014 A | * | 8/2017 | ........... G09G 3/3266 |
| CN | 107039014 A | | 8/2017 | |
| CN | 208141796 U | | 11/2018 | |
| CN | 109147646 A | | 1/2019 | |
| CN | 110164352 A | | 8/2019 | |
| KR | 20190009218 A | | 1/2019 | |

* cited by examiner

SHIFTING REGISTER, DRIVING METHOD THEREOF, DRIVING CIRCUIT AND DISPLAY DEVICE

CROSS REFERENCE TO RELATED APPLICATION

The present application is a National Stage of International Application No. PCT/CN2020/140309, filed Dec. 28, 2020, which claims priority of the Chinese Patent Application No. 202010105859.4, filed to the China Patent Office on Feb. 19, 2020, and entitled "SHIFTING REGISTER, DRIVING METHOD THEREOF, DRIVING CIRCUIT AND DISPLAY DEVICE", of which the entire contents are incorporated herein by reference.

FIELD

The present disclosure relates to the technical field of display, in particular to a shifting register, a driving method thereof, a driving circuit and a display device.

BACKGROUND

With the rapid development of a display technology, display panels are more and more developed in a high-integration-density and low-cost direction. In a gate driver on array (GOA) technology, gate switch circuits of a thin film transistor (TFT) are integrated on an array substrate of a display panel to form scan driving on the display panel, so that a wiring space of a bonding area and a fan-out area of a gate integrated circuit (IC) is omitted, hence not only is the product cost reduced on two aspects of material cost and preparation process, but also an attractive design of bilateral symmetry and narrow-bezel of the display panel is realized. Moreover, this integration process can also omit a bonding process in a gate scan line, thereby improving production capacity and yield.

SUMMARY

An embodiment of the present disclosure provides a shifting register, including:
a control circuit, configured to adjust signals of a first node and a second node according to a signal of a first clock signal end, a signal of a second clock signal end and a signal of an input signal end;
a first output circuit, configured to provide a signal of a first reference signal end to an output signal end in response to the signal of the first node; and
a first switching transistor, wherein a first end of the first switching transistor is electrically connected with the second node, a control end of the first switching transistor is electrically connected with a second reference signal end, and a second end of the first switching transistor is electrically connected with a second output circuit; and
the second output circuit is configured to provide a signal of the second reference signal end to the output signal end under control of a signal of the second end of the first switching transistor.

Optionally, the control circuit includes: an input circuit, a first node control circuit and a second node control circuit, wherein:
the input circuit is configured to provide the signal of the first reference signal end to a third node in response to the signal of the second clock signal and the signal of the input signal end;
the first node control circuit is configured to adjust a signal of the third node according to the signal of the first clock signal end, provide the signal of the first clock signal end to the first node in response to the signal of the third node and provide the signal of the first reference signal end to the first node in response to the signal of the second node; and
the second node control circuit is configured to provide the signal of the input signal end to the second node in response to the signal of the first clock signal end.

Optionally, the input circuit includes: a second switching transistor and a third switching transistor, wherein:
a first end of the second switching transistor is electrically connected with the first reference signal end, a control end of the second switching transistor is electrically connected with the input signal end, and a second end of the second switching transistor is electrically connected with the third node; and
a first end of the third switching transistor is electrically connected with the first reference signal end, a control end of the third switching transistor is electrically connected with the second clock signal end, and a second end of the third switching transistor is electrically connected with the third node.

Optionally, the first node control circuit includes: a fourth switching transistor, a fifth switching transistor and a first capacitor, wherein:
a first end of the fourth switching transistor is electrically connected with the first clock signal end, a control end of the fourth switching transistor is electrically connected with the third node, and a second end of the fourth switching transistor is electrically connected with the first node;
a first end of the fifth switching transistor is electrically connected with the first reference signal end, a control end of the fifth switching transistor is electrically connected with the second node, and a second end of the fifth switching transistor is electrically connected with the first node; and
a first end of the first capacitor is electrically connected with the first clock signal end, and a second end of the first capacitor is electrically connected with the third node.

Optionally, the second node control circuit includes: a sixth switching transistor, wherein a first end of the sixth switching transistor is electrically connected with the input signal end, a control end of the sixth switching transistor is electrically connected with the first clock signal end, and a second end of the sixth switching transistor is electrically connected with the second node.

Optionally, the first output circuit includes: a seventh switching transistor and a second capacitor, wherein:
a first end of the seventh switching transistor is electrically connected with the first reference signal end, a control end of the seventh switching transistor is electrically connected with the first node, and a second end of the seventh switching transistor is electrically connected with the output signal end; and
a first end of the second capacitor is electrically connected with the first node, and a second end of the second capacitor is electrically connected with the first reference signal end.

Optionally, the second output circuit includes: an eighth switching transistor and a third capacitor, wherein:
a first end of the eighth switching transistor is electrically connected with the second reference signal end, a control end of the eighth switching transistor is electrically connected with the second end of the first switching transistor, and a second end of the eighth switching transistor is electrically connected with the output signal end; and a first end of the third capacitor is electrically connected with the second end of the first switching transistor, and a second end of the third capacitor is electrically connected with the output signal end.

Correspondingly, an embodiment of the present disclosure further provides some driving circuits including any of the above-mentioned shifting registers, wherein:

an input signal end of a first level of the shifting registers is electrically connected with a trigger signal end; and in the every two adjacent levels of the shifting registers, an input signal end of a next level of the shifting registers is electrically connected with an output signal end of a previous level of the shifting registers.

Correspondingly, an embodiment of the present disclosure further provides some display devices, including the above-mentioned driving circuits.

Correspondingly, an embodiment of the present disclosure further provides some driving methods of any of the above-mentioned shifting registers, including:

in a first stage, loading a signal of a second electrical level to an input signal end, loading a signal of a first electrical level to a first clock signal end, and loading the signal of the second electrical level to a second clock signal end;

in a second stage, loading the signal of the second electrical level to the inpit signal end, loading the signal of the second electrical level to the first clock signal end, and loading the signal of the first electrical level to the second clock signal end;

in a third stage, loading the signal of the first electrical level to the input signal end, loading the signal of the first electrical level to the first clock signal end, and loading the signal of the second electrical level to the second clock signal end; and in a fourth stage, loading the signal of the first electrical level to the input signal end, loading the signal of the second electrical level to the first clock signal end, and loading the signal of the first electrical level to the second clock signal end.

DETAILED DESCRIPTION OF THE EMBODIMENTS

Figure 1:
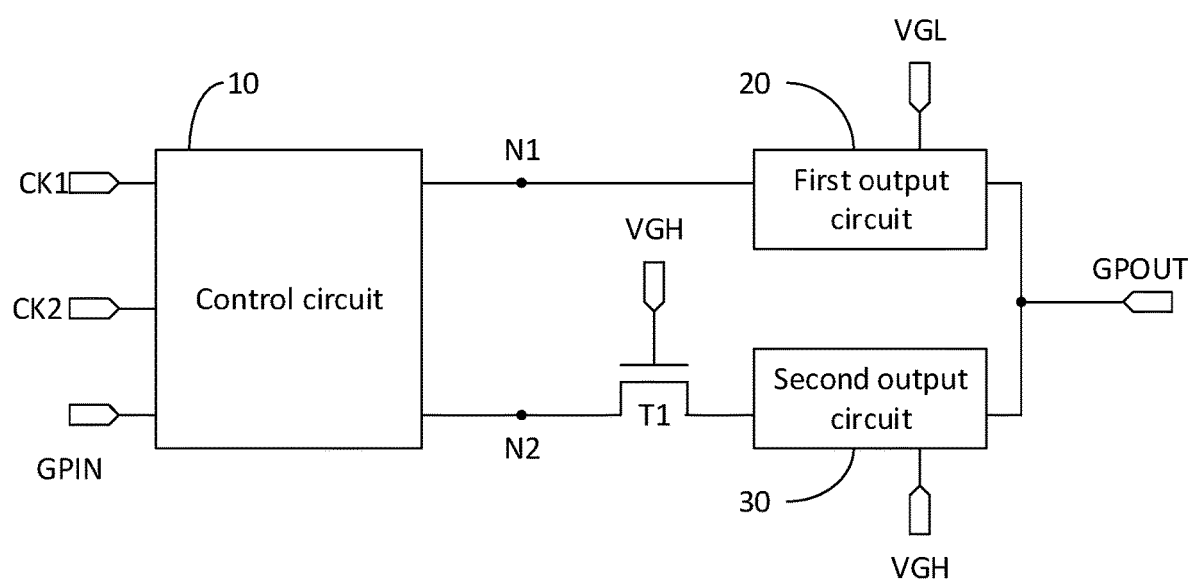
FIG. 1 is a schematic structural diagram of some shifting registers provided by an embodiment of the present disclosure.

In order to make the objectives, technical solutions and advantages of embodiments of the present disclosure clearer, the technical solutions of embodiments of the present disclosure will be clearly and completely described in detail below with reference to the accompanying drawings of the embodiments of the present disclosure. Apparently, the described embodiments are a part of the embodiments of the present disclosure, rather than all of the embodiments. And without conflict, the embodiments in the present disclosure and features in the embodiments can be inter-combined. Based on the described embodiments of the present disclosure, all other embodiments obtained by those of ordinary skill in the art without creative work shall fall within the protection scope of the present disclosure.

Unless otherwise defined, technical terms or scientific terms used in the present disclosure shall have the ordinary meanings understood by those of ordinary skill in the art to which the present disclosure belongs. As used in the present disclosure, "first", "second" and similar words do not indicate any order, quantity or importance, but are only used to distinguish different components. Similar words such as "include" or "comprise" mean that an element or item appearing before the word covers an element or item listed after the word and their equivalents, but does not exclude other elements or items. Similar words such as "connection" or "coupling" are not limited to physical connection or mechanical connection, but may include electrical connection, whether direct or indirect.

It should be noted that the sizes and shapes of all the figures in the drawings do not reflect the true scale, but are merely illustrative of the content of the present disclosure. The same or similar reference numerals throughout refer to the same or similar elements or elements having the same or similar functions.

As shown in FIG. 1, an embodiment of the present disclosure provides some shifting registers, which may include:

a control circuit 10, configured to adjust signals of a first node N1 and a second node N2 according to a signal of a first clock signal end CK1, a signal of a second clock signal end CK2 and a signal of an input signal end GPIN;

a first output circuit 20, configured to provide a signal of a first reference signal end VGL to an output signal end GPOUT in response to the signal of the first node N1; and a first switching transistor T1, wherein a first end of the first switching transistor T1 and the second node N2 are electrically connected, a control end of the first switching transistor T1 and a second reference signal end VGH are electrically connected, and a second end of the first switching transistor T1 and a second output circuit 30 are electrically connected; and the second output circuit 30 is used to provide a signal of the second reference signal end VGH to the output signal end GPOUT under control of a signal of the second end of the first switching transistor T1.

The above-mentioned shifting register provided by the embodiment of the present disclosure may realize shifting output of a signal through interaction of the above-mentioned circuits. Moreover, the second output circuit and the second node may be isolated by setting the first switching transistor so as to reduce an influence of a leak current to the signal of the second end of the first switching transistor, and the signal of the second end of the first switching transistor is more stable. Therefore, the second output circuit may stably provide the signal of the second reference signal end to the output signal end, and a signal output by the output signal end is more stable.

Moreover, a signal output by the above-mentioned shifting register provided by the embodiment of the present disclosure may serve as a light-emitting control signal of a light-emitting control transistor, and may also serve as a gate scanning signal of a scanning control transistor.

Figure 2:
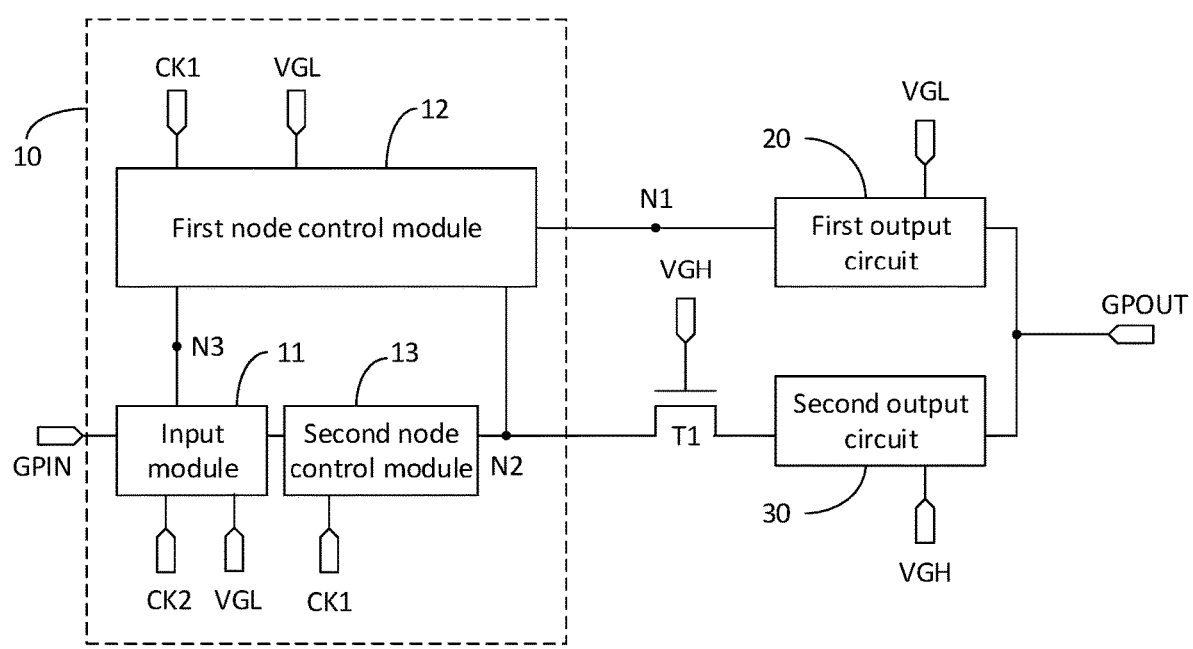
FIG. 2 is a schematic structural diagram of some shifting registers provided by an embodiment of the present disclosure.

During implementation, as shown in FIG. 2, the control circuit 10 may include: an input circuit 11, a first node control circuit 12 and a second node control circuit 13, wherein:
  the input circuit 11 is configured to provide a signal of the first reference signal end to a third node N3 in response to a second clock signal end CK2 and a signal of an input signal end GPIN;
  the first node control circuit 12 is configured to adjust a signal of a third node N3 according to the signal of the first clock signal end CK1, provide the signal of the first clock signal end CK1 to the first node N1 in response to the signal of the third node N3, and provide the signal of the first reference signal end VGL to the first node N1 in response to the signal of the second node N2; and
  the second node control circuit 13 is configured to provide the signal of the input signal end GPIN to the second node N2 in response to the signal of the first clock signal end CK1.

During implementation, the control circuit 10 may adjust the signal of the third node N3 according to the signal of the first clock signal end CK1, the signal of the second clock signal end CK2 and the signal of the input signal end GPIN through interaction of the input circuit 11 and the first node control circuit 12, so as to adjust the signal of the first node N1. By setting the second node control circuit 13, the signal of the input signal end GPIN may be provided to the second node N2 in response to the signal of the first clock signal end CK1.

Figure 3:
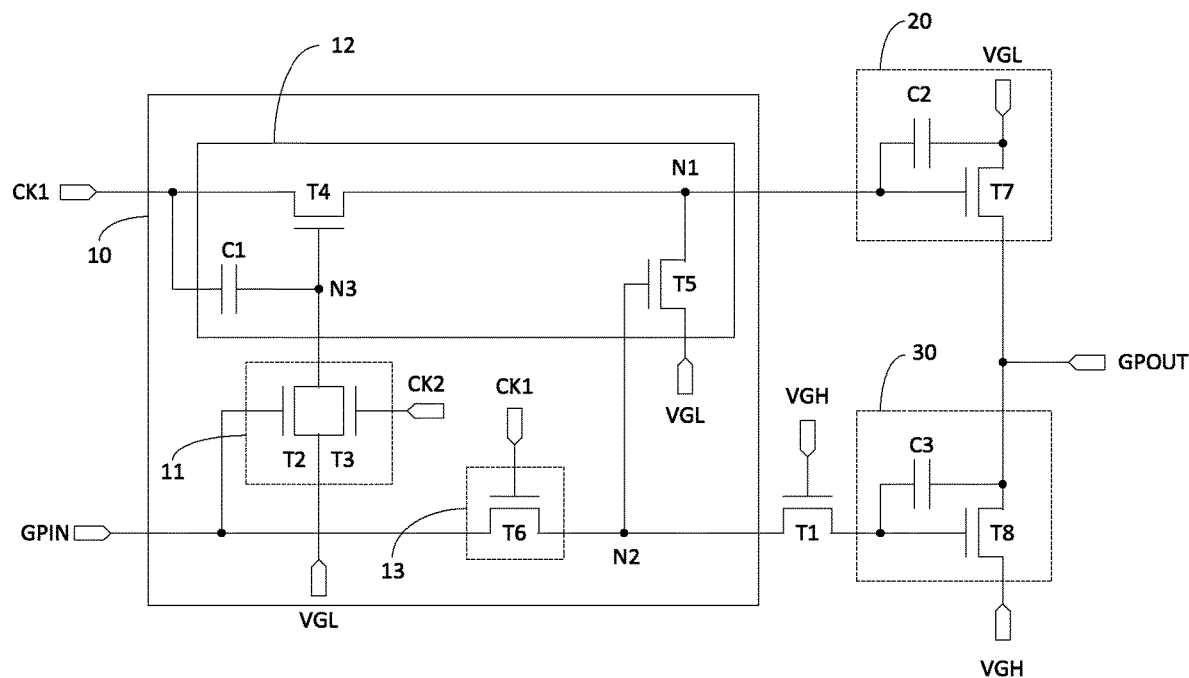
FIG. 3 is a specific schematic structural diagram of some shifting registers provided by an embodiment of the present disclosure.

During implementation, in some embodiments of the present disclosure, as shown in FIG. 3, the input circuit 11 may include: a second switching transistor T2 and a third switching transistor T3, wherein:
  a first end of the second switching transistor T2 and the first reference signal end VGL are electrically connected, a control end of the second switching transistor T2 and the input signal end GPIN are electrically connected, and a second end of the second switching transistor T2 and the third node N3 are electrically connected; and
  a first end of the third switching transistor T3 and the first reference signal end VGL are electrically connected, a control end of the third switching transistor T3 and the second clock signal end CK2 are electrically connected, and a second end of the third switching transistor T3 and the third node N3 are electrically connected.

During implementation, the second switching transistor T2 may provide the signal of the first reference signal end VGL to the third node N3 when being in a conduction state in response to the signal of the input signal end GPIN.

During implementation, the third switching transistor T3 may provide the signal of the first reference signal end VGL to the third node N3 when being in a conduction state in response to the signal of the second clock signal end CK2.

During implementation, in some embodiments of the present disclosure, as shown in FIG. 3, the first node control circuit 12 may include: a fourth switching transistor T4, a fifth switching transistor T5 and a first capacitor C1, wherein:
  a first end of the fourth switching transistor T4 and the first clock signal end CK1 are electrically connected, a control end of the fourth switching transistor T4 and the third node N3 are electrically connected, and a second end of the fourth switching transistor T4 and the first node N1 are electrically connected;
  a first end of the fifth switching transistor T5 and the first reference signal end VGL are electrically connected, a control end of the fifth switching transistor T5 and the second node N2 are electrically connected, and a second end of the fifth switching transistor T5 and the first node N1 are electrically connected; and
  a first end of the first capacitor C1 and the first clock signal end CK1 are electrically connected, and a second end of the first capacitor C1 and the third node N3 are electrically connected.

During implementation, the fourth switching transistor T4 may provide the signal of the first clock signal end CK1 to the first node N1 when being in a conduction state in response to the signal of the third node N3.

During implementation, the fifth switching transistor T5 may provide the signal of the first reference signal end VGL to the first node N1 when being in a conduction state in response to the signal of the second node N2.

During implementation, the first capacitor keeps voltage difference of two ends thereof stable, and when a voltage of the signal of the first clock signal end CK1 changes, the first capacitor C1 may adjust a voltage of the signal of the third node N3.

During implementation, in some embodiments of the present disclosure, as shown in FIG. 3, the second node control circuit 13 may include: a sixth switching transistor T6, wherein a first end of the sixth switching transistor T6 and the input signal end GPIN are electrically connected, a control end of the sixth switching transistor T6 and the first clock signal end CK1 are electrically connected, and a second end of the sixth switching transistor T6 and the second node N2 are electrically connected.

During implementation, the sixth switching transistor T6 may provide the signal of the input signal end GPIN into the second node N2 when being in a conduction state in response to the signal of the first clock signal end CK1.

During implementation, in some embodiments of the present disclosure, as shown in FIG. 3, the first output circuit 20 may include: a seventh switching transistor T7 and a second capacitor C2, wherein:
  a first end of the seventh switching transistor T7 and the first reference signal end VGL are electrically connected, a control end of the seventh switching transistor T7 and the first node N1 are electrically connected, and a second end of the seventh switching transistor T7 and the output signal end GPOUT are electrically connected; and
  a first end of the second capacitor C2 and the first node N1 are electrically connected, and a second end of the second capacitor C2 and the first reference signal end VGL are electrically connected.

During implementation, the seventh switching transistor T7 may provide the signal of the first reference signal end to the output signal end GPOUT when being in a conduction state in response to the signal of the first node N1.

During implementation, the second capacitor C2 may store the signal of the first node N1, and voltage difference between the first node N1 and the control end of the seventh switching transistor may be kept unchanged when the first node N1 is in a suspension joint state.

During implementation, in some embodiments of the present disclosure, as shown in FIG. 3, the second output circuit 30 may include: an eighth switching transistor T8 and a third capacitor C3, wherein:

a first end of the eighth switching transistor T8 and the second reference signal end VGH are electrically connected, a control end of the eighth switching transistor and the second end of the first switching transistor T1 are electrically connected, and a second end of the eighth switching transistor T8 and the output signal end GPOUT are electrically connected; and a first end of the third capacitor C3 and the second end of the first switching transistor T1 are electrically connected, and a second end of the third capacitor C3 and the output signal end GPOUT are electrically connected.

During implementation, the eighth switching transistor T8 may provide the signal of the second reference signal end VGH to the output signal end GPOUT when being in a conduction state in response to the signal of the second end of the first switching transistor T1.

During implementation, the third capacitor C3 keeps voltage difference of two ends thereof unchanged, and the third capacitor C3 may adjust a voltage of the signal of the second end of the first switching transistor T1 when a voltage of the signal of the input signal end GPIN changes.

The above just illustrates specific structures of all the circuits in the shifting register provided by embodiments of the present disclosure, the structures of the above circuits may also be other structures known by those of skill in the art without limitation to the above structures provided by embodiments of the present disclosure, which are not limited herein.

In order to make manufacture crafts unified, in the shifting register provided by embodiments of the present disclosure, as shown in FIG. 3, all switching transistors are N-type transistors, certainly, and all switching transistors may also be P-type transistors, which is not limited herein.

Optionally, in the shifting register provided by embodiments of the present disclosure, the P-type transistors are conducted under action of a low level signal and are cut off under action of a high level signal; and the N-type transistors are conducted under action of a high level signal and are cut off under action of a low level signal.

Optionally, in the shifting register provided by embodiments of the present disclosure, all the switching transistors may be thin film transistors (TFTs), and may also be metal oxide semiconductors (MOSs), which is not limited herein. In accordance with different types of the above switching transistors and different signals of the control ends of the switch transistors, the control ends of the switch transistors serve as gates, the first ends of the switching transistors may serve as sources and the second ends of the switching transistors serve as drains, or the first ends of the switching transistors serve as drains and the second ends of the switching transistors serve as sources, which are not distinguished specifically herein.

During implementation, as shown in FIG. 3, in the shifting register provided by the embodiment of the present disclosure, all the switching transistors may be N-type transistors, therefore the signal of the first reference signal end VGL may be a low level signal, and the signal of the second reference signal end VGH may be a high level signal. In the shifting register provided by the embodiment of the present disclosure, all the switching transistors may also be P-type transistors, therefore the signal of the first reference signal end VGL may be a high level signal, and the signal of the second reference signal end VGH may be a low level signal.

During implementation, a high level voltage of the first clock signal end CK1 may be the same as a voltage of the second reference signal end VGH. A low level voltage of the first clock signal end CK1 may be the same as a voltage of the first reference signal end VGL. Of course, specific voltage values of the first clock signal end CK1, the second clock signal end CK2, the first reference signal end VGL and the second reference signal end VGH may be determined in accordance with actual application, which is not limited herein.

The following is a detailed explanation of the present disclosure in combination with a specific embodiment. It should be noted that the purpose of embodiments is to better interpret, but not limit, the present disclosure.

An operation process of the shifting register provided by the embodiment of the present disclosure is described below in conjunction with a circuit sequence diagram. In the following descriptions, 1 denotes a high level and 0 denotes a low level. It should be noted that 1 and 0 are logic levels and are only used to better explain the specific operation process of the embodiment of the present disclosure and are not specific voltage values.

Figure 4:
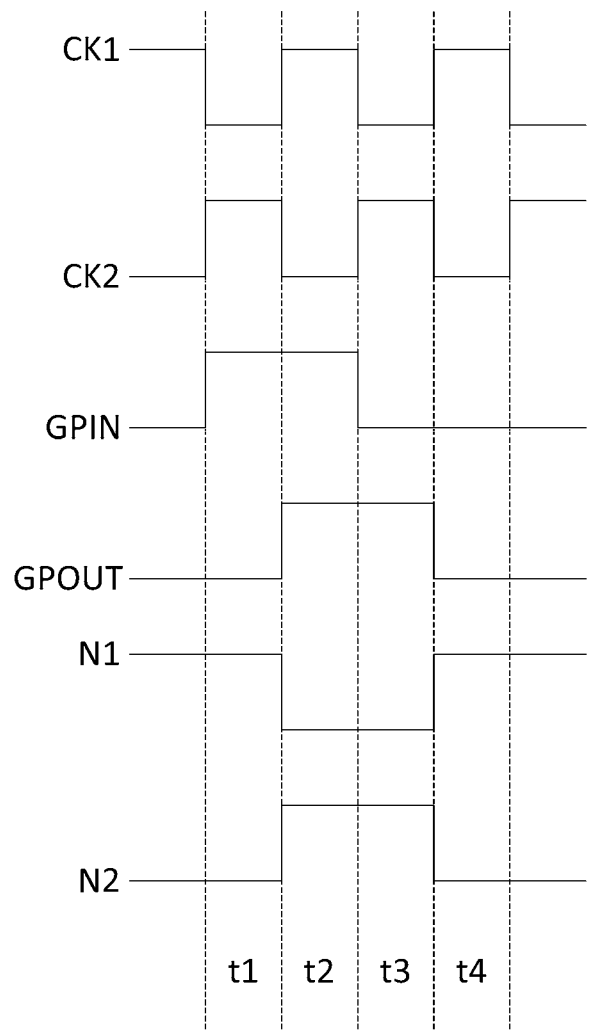
FIG. 4 is a signal sequence diagram provided by an embodiment of the present disclosure.

Taking a structure of the shifting register shown in FIG. 3 as an example, the operation process of the shifting register provided by embodiments of the present disclosure is described below in conjunction with the signal sequence diagram shown in FIG. 4. The signal of the first reference signal end VGL is a low level signal, and the signal of the second reference signal end VGH is a high level signal. Optionally, a first stage t1, a second stage t2, a third stage t3 and a fourth stage t4 of the signal sequence diagram shown in FIG. 4 are selected.

In the first stage t1, CK1=0, CK2=1, and GPIN=1.

Since CK1=0, the sixth switching transistor T6 is cut off; since CK2=1, the third switching transistor T3 is conducted; and since GPIN=1, the second switching transistor T2 is conducted.

The second switching transistor T2 and the third switching transistor T3 are conducted, the low level signal of the first reference signal end VGL is provided to the third node N3, so that the signal of the third node N3 is a low level signal, and the fourth switching transistor T4 is cut off.

The sixth switching transistor T6 is cut off, and the second node N2 maintains a signal of a previous stage. The signal of the second node N2 is a low level signal, and the fifth switching transistor T5 is cut off. The high level signal of the second reference signal end VGH enables the first switch transistor T1 to be conducted, the low level signal of the second node N2 is provided to the control end of the eighth switching transistor T8, and the eighth switching transistor T8 is cut off.

The signal of the first node N1 is maintained as a high level signal, and the seventh switching transistor T7 is conducted. The low level signal of the first reference signal end VGL is provided to the output signal end GPOUT, so that the output signal end GPOUT outputs a low level signal.

In the second stage t2, CK1=1, CK2=0, and GPIN=1.

Since CK1=1, the sixth switching transistor T6 is conducted; since CK2=1, the third switching transistor T3 is cut off; and since GPIN=1, the second switching transistor T2 is conducted.

The second switching transistor T2 is conducted, and the low level signal of the first reference signal end VGL is provided to the third node N3, so that the signal of the third node N3 is a low level signal, and the fourth switching transistor T4 is cut off.

The sixth switching transistor T6 is conducted, and the high level signal of the input signal end GPIN is provided to the second node N2, so that the second node N2 is a high level. The fifth switching transistor T5 is conducted, and the low level signal of the first reference signal end VGL is provided to the first node N1, so that the signal of the first node N1 is a low level, and the seventh switching transistor T7 is cut off.

The high level signal of the second reference signal end VGH enables the first switching transistor T1 to be conducted, and the high level signal of the second node N2 is provided to the control end of the eighth switching transistor T8. The eighth switching transistor T8 is conducted, and the high level signal of the second reference signal end VGH is provided to the output signal end GPOUT. The second end of the third capacitor C3 is changed from a low level to a high level. Due to a bootstrap action of the third capacitor C3, a voltage of the signal of the control end of the eighth switching transistor T8 is raised. At this point, a voltage of the signal of the second end of the first switching transistor T1 is higher than a voltage of the high level signal of the second reference signal end VGH, and voltages of the signals of the first end and the control end of the first switching transistor T1 are equal to the voltage of the high level signal of the second reference signal end VGH, so that the first switching transistor T1 is cut off. The voltage of the signal of the control end of the eighth switching transistor T8 is higher than the voltage of the high level signal of the second reference signal end VGH, so that a conduction degree of the eighth switching transistor T8 is improved.

In addition, since the first switching transistor T1 is off, the control end of the eighth switching transistor T8 may be isolated from the second node N2, reducing an influence of the leak current on the signal of the control end of the eighth switching transistor T8, so that the signal of the control end of the eighth switching transistor T8 is more stable. Then the eighth switching transistor T8 may stably provide the high level signal of the second reference signal end VGH to the output signal end GPOUT, so that the signal output by the output signal end GPOUT is more stable.

In the third stage t3, CK1=0, CK2=1, and GPIN=0.

Since CK1=0, the sixth switching transistor T6 is cut off; since CK2=1, the third switching transistor T3 is conducted; and since GPIN=0, the second switching transistor T2 is cut off.

The third switching transistor T3 is conducted, and the low level signal of the first reference signal end VGL is provided to the third node N3, so that the signal of the third node N3 is a low level signal, and the fourth switching transistor T4 is cut off.

The fourth switching transistor T4 and the sixth switching transistor T6 are both cut off, so the first node N1 and the second node N2 maintain signals of a previous stage. The second node N2 maintains a high level signal, the fifth switching transistor T5 is conducted, and the low level signal of the first reference signal end VGL is provided to the first node N1. The first node N1 maintains a low level signal, and the seventh switching transistor T7 is cut off. The voltage of the signal of the control end of the eighth switching transistor T8 remains unchanged, therefore the first switching transistor T1 is still cut off, the eighth switching transistor T8 is conducted, the high level signal of the second reference signal end VGH is provided to the output signal end GPOUT, and the output signal end GPOUT outputs a high level signal.

In the fourth stage t4, CK1=1, CK2=0, and GPIN=0.

Since CK1=1, the sixth switching transistor T6 is conducted; since CK2=0, the third switching transistor T3 is cut off; and since GPIN=0, the second switching transistor T2 is cut off.

The signal of the first clock signal end CK1 changes from a low level to a high level at the beginning of the fourth stage t4. Due to a bootstrap action of the first capacitor C1, a voltage of the signal of the third node N3 is raised, so that the signal of the third node N3 is a high level signal, and the fourth switching transistor T4 is conducted.

The sixth switching transistor T6 is conducted, and the low level signal of the input signal end GPIN is provided to the second node N2, so that the second node N2 is a low level. The fifth switching transistor T5 is cut off. The second node N2 is a low level, and the control end of the first switching transistor T1 is a high level, so that the first switching transistor T1 is conducted, the low level signal is provided to the control end of the eighth switching transistor T8, and the eighth switching transistor T8 is cut off.

The fourth switch transistor T4 is conducted, and the high level signal of the first clock signal end CK1 is provided to the first node N1, so that the first node N1 is a high level. The seventh switch transistor T7 is conducted, the low level signal of the first reference signal end VGL is provided to the output signal end GPOUT, and the output signal end GPOUT outputs a low level signal.

Figure 5:
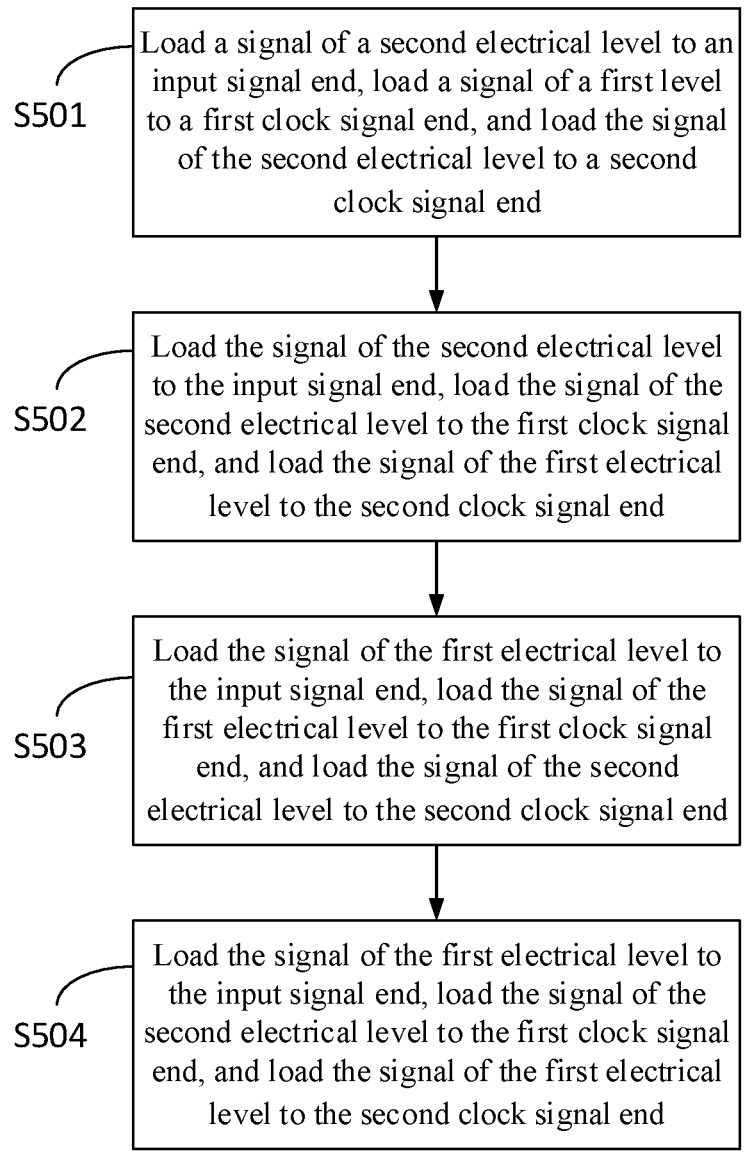
FIG. 5 is a flow diagram of a driving method provided by an embodiment of the present disclosure.

Based on the same inventive concept, an embodiment of the present disclosure further provides some driving methods of any of the above shifting registers provided by the embodiment of the present disclosure, as shown in FIG. 5, including:

S501, in a first stage, a signal of a second electrical level is loaded to an input signal end, a signal of a first electrical level is loaded to a first clock signal end, and a signal of the second electrical level is loaded to a second clock signal end;

S502, in a second stage, the signal of the second electrical level is loaded to the input signal end, the signal of the second electrical level is loaded to the first clock signal end, and the signal of the first electrical level is loaded to the second clock signal end;

S503, in a third stage, the signal of the first electrical level is loaded to the input signal end, the signal of the first electrical level is loaded to the first clock signal end, and the signal of the second electrical level is loaded to the second clock signal end; and S504, in a fourth stage, the signal of the first electrical level is loaded to the input signal end, the signal of the second electrical level is loaded to the first clock signal end, and the signal of the first electrical level is loaded to the second clock signal end.

According to the above driving method provided by embodiments of the present disclosure, the shifting register may output signals stably. During implementation, in the above driving method provided by embodiments of the present disclosure, a first electrical level may be a low level, and correspondingly, a second electrical level may be a high level; or conversely, the first electrical level may be a high level, and correspondingly, the second electrical level may be a low level, which is specifically needed to be determined depending on whether the transistors in the shifting register are N-type or P-type transistors. Optionally, FIG. 4 shows some signal timing diagrams where the transistors in the shifting register are N-type transistors, the first electrical level is a low level and the second electrical level is a high level.

Figure 6:
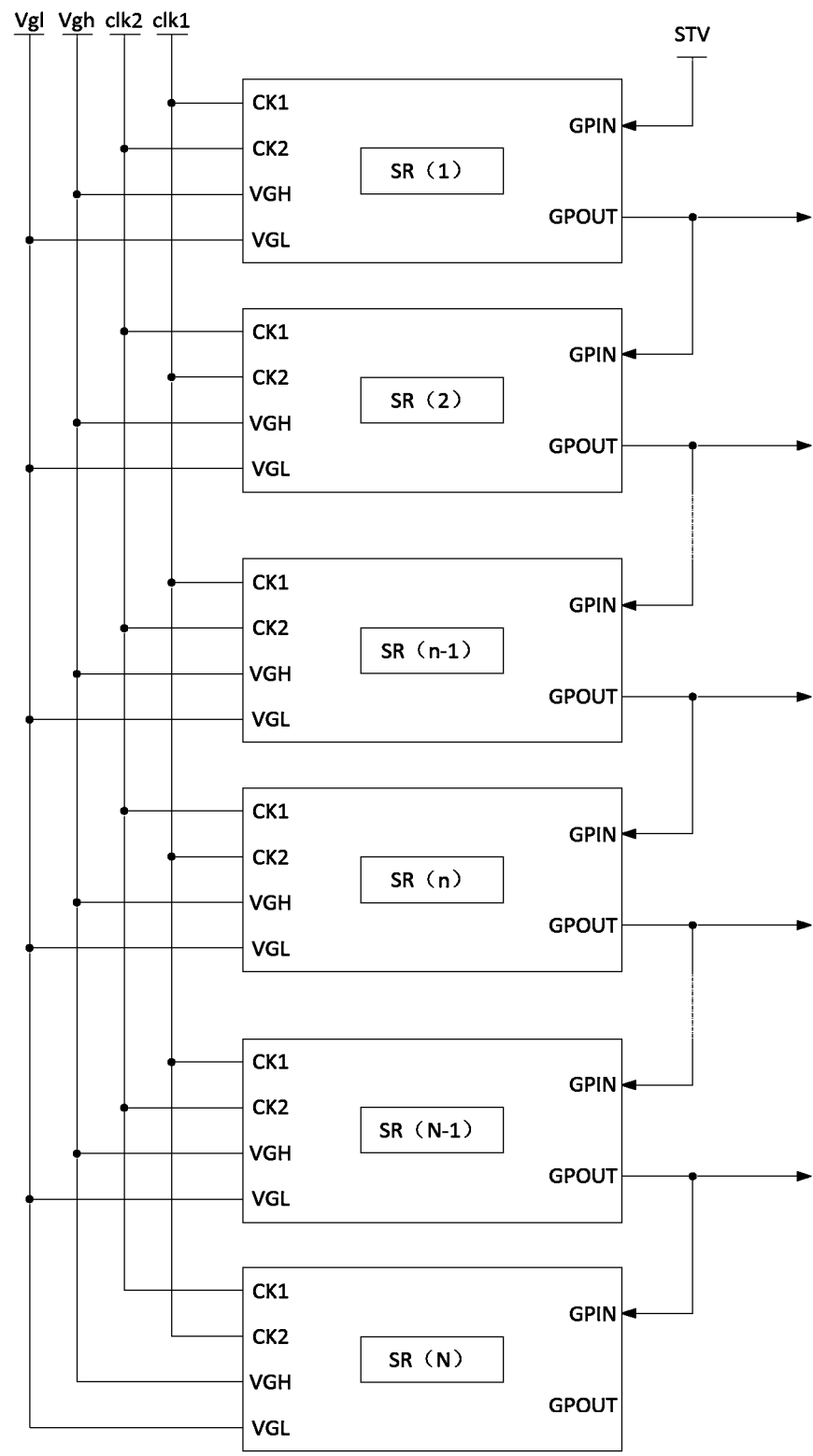
FIG. 6 is a schematic structural diagram of a driving circuit provided by an embodiment of the present disclosure.

Based on the same inventive concept, an embodiment of the present disclosure further provides some driving circuits, as shown in FIG. 6, including a plurality of any of the shifting registers provided by embodiments of the present disclosure which are cascaded, such as SR(1), SR(2) . . . SR(n−1), SR(n) . . . , SR(N-1), SR(N) (total N shifting registers, 1≤N≤N); wherein, an input signal end GPIN of a first level of the shifting register SR(1) is electrically connected with a frame trigger signal end STV; and except for the first level of the shifting register SR(1), input signal ends GPIN of shifting registers SR(n) of other levels are electrically connected with output signal ends GPOUT of adjacent shifting registers SR(n−1) of previous levels respectively.

A structure of each shifting register in the above driving circuits is the same in function and structure as any of the above shifting registers provided by embodiments of the present disclosure, and repetition will not be made herein.

During implementation, in the above driving circuits provided by the present disclosure, first reference signal ends VGL of the shifting registers at all levels are connected to a same reference signal line Vgl, and second reference signal ends VGH of the shifting registers at all levels are connected to a same reference signal line Vgh.

During implementation, first clock signal ends CK1 of odd-number-level shifting registers are electrically connected to a first clock line clk1, and second clock signal ends CK2 are electrically connected to a second clock line clk2; and first clock signal ends CK1 of even-number-level shifting registers are electrically connected to the second clock line clk2, and second clock signal ends CK2 are electrically connected to the first clock line clk1.

During implementation, the driving circuits provided by embodiments of the present disclosure may serve as gate drive driving circuits to provide gate scanning signals for scanning control transistors.

During implementation, the driving circuits provided by embodiments of the present disclosure may serve as light-emitting driving circuits to provide light-emitting control signals for light-emitting control transistors.

Based on the same disclosed concept, an embodiment of the present disclosure further provides some display devices, including the above driving circuits provided by the present disclosure. Specific implementation thereof may be referred to the implementation process of the above shifting registers, and common points will not be repeated.

During implementation, the above display devices provided by embodiments of the present disclosure may be organic light-emitting display devices or liquid crystal display devices, which is not limited herein.

In an organic light-emitting display device, a plurality of organic light-emitting diodes and a pixel circuit connected with all the organic light-emitting diodes are generally arranged. The pixel circuit is generally provided with a light-emitting control transistor for controlling light emitting of the organic light-emitting diodes and a scanning control transistor for controlling data signal input. During implementation, when the above display device provided by embodiments of the present disclosure is the organic light-emitting display device, the organic light-emitting display device may include one of the above driving circuits provided by embodiments of the present disclosure, the driving circuit may serve as a light-emitting driving circuit to provide a light-emitting control signal for the light-emitting control transistor; or the driving circuit may serve as a gate driving circuit to provide a gate scanning signal for the scanning control transistor. Of course, the organic light-emitting display device may also include two of the above driving circuits provided by embodiments of the present disclosure, one of the driving circuits may serve as the light-emitting driving circuit to provide the light-emitting control signal for the light-emitting control transistor, and the other of the driving circuits may serve as the gate driving circuit to provide the gate scanning signal for the scanning control transistor, which is not limited herein.

In a liquid crystal display device, a plurality of pixel electrodes and a switching transistor connected with all the pixel electrodes are generally arranged. During implementation, when the above display device provided by embodiments of the present disclosure is the liquid crystal display device, the above driving circuit provided by embodiments of the present disclosure may serve as a gate driving circuit to provide a gate scanning signal of the switching transistor.

The display device may be: a mobile phone, a tablet computer, a TV, a display, a notebook computer, a digital photo frame, a navigator and other any products or components with a display function. Other essential components of the display device should be understood by those of ordinary skill in the art and are not described herein, and they should not be construed as restrictions on the present disclosure.

Some shifting registers provided by embodiments of the present disclosure include: a control circuit, a first output circuit, and a second output circuit. Through cooperation of the above circuits, shifting output of signals may be realized, and the output signals may serve as light-emitting control signals for light-emitting control transistors, or gate scanning signals for scanning control transistors. Some driving circuits provided by the embodiment of the present disclosure include any of the above shifting registers. By integrating the above driving circuits on a display panel to provide scanning driving signals or light-emitting driving signals for the display panel, an attractive design of bilateral symmetry and narrow-bezel of the display panel may be realized, and moreover, a bonding process in a direction of a gate scanning line may be omitted, so the production capacity and yield are improved.

It is obvious that those of skill in the art may make various modifications and variations to the present disclosure without departing from the spirit and scope of the present disclosure. Thus, if such modifications and variations of the present disclosure fall within the scope of the claims of the present disclosure and their equivalents, the present disclosure is also intended to include such modifications and variations.

What is claimed is:

1. A shifting register, comprising:
a control circuit, configured to adjust signals of a first node and a second node according to a signal of a first clock signal end, a signal of a second clock signal end and a signal of an input signal end;
a first output circuit, configured to provide a signal of a first reference signal end to an output signal end in response to the signal of the first node; and
a first switching transistor, wherein a first end of the first switching transistor is electrically connected with the second node, a control end of the first switching transistor is electrically connected with a second reference signal end, and a second end of the first switching transistor is electrically connected with a second output circuit; and the second output circuit is configured to provide a signal of the second reference signal end to the output signal end under control of a signal of the second end of the first switching transistors;

wherein the control circuit comprises: an input circuit, a first node control circuit and a second node control circuit;

the input circuit is configured to provide the signal of the first reference signal end to a third node in response to the signal of the second clock signal end and the signal of the input signal end;

the first node control circuit is configured to adjust a signal of the third node according to the signal of the first clock signal end, provide the signal of the first clock signal end to the first node in response to the signal of the third node, and provide the signal of the first reference signal end to the first node in response to the signal of the second node; and the second node control circuit is configured to provide the signal of the input signal end to the second node in response to the signal of the first clock signal end.

2. The shifting register according to claim 1, wherein the input circuit comprises: a second switching transistor and a third switching transistor;

a first end of the second switching transistor is electrically connected with the first reference signal end, a control end of the second switching transistor is electrically connected with the input signal end, and a second end of the second switching transistor is electrically connected with the third node; and a first end of the third switching transistor is electrically connected with the first reference signal end, a control end of the third switching transistor is electrically connected with the second clock signal end, a second end of the third switching transistor is electrically connected with the third node.

3. The shifting register according to claim 1, wherein the first node control circuit comprises: a fourth switching transistor, a fifth switching transistor and a first capacitor;

a first end of the fourth switching transistor is electrically connected with the first clock signal end, a control end of the fourth switching transistor is electrically connected with the third node, and a second end of the fourth switching transistor is electrically connected with the first node;

a first end of the fifth switching transistor is electrically connected with the first reference signal end, a control end of the fifth switching transistor is electrically connected with the second node d, and a second end of the fifth switching transistor is electrically connected with the first node; and a first end of the first capacitor is electrically connected with the first clock signal end, and a second end of the first capacitor is electrically connected with the third node.

4. The shifting register according to claim 1, wherein the second node control circuit comprises: a sixth switching transistor; and a first end of the sixth switching transistor is electrically connected with the input signal end, a control end of the sixth switching transistor is electrically connected with the first clock signal end, and a second end of the sixth switching transistor is electrically connected with the second node.

5. The shifting register according to claim 1, wherein the first output circuit comprises: a seventh switching transistor and a second capacitor;

a first end of the seventh switching transistor is electrically connected with the first reference signal end, a control end of the seventh switching transistor is electrically connected with the first node, and a second end of the seventh switching transistor is electrically connected with the output signal end; and a first end of the second capacitor is electrically connected with the first node, and a second end of the second capacitor is electrically connected with the first reference signal end.

6. The shifting register according to claim 1, wherein the second output circuit comprises: an eighth switching transistor and a third capacitor;

a first end of the eighth switching transistor is electrically connected with the second reference signal end, a control end of the eighth switching transistor is electrically connected with the second end of the first switching transistor, and a second end of the eighth switching transistor is electrically connected with the output signal end; and a first end of the third capacitor is electrically connected with the second end of the first switching transistor, and the second end of the third transistor is electrically connected with the output signal end.

7. A method for driving the shifting register according to claim 1, comprising:

in a first stage, loading a signal of a second electrical level to the input signal end, loading a signal of a first electrical level to the first clock signal end, and loading the signal of the second electrical level to the second clock signal end;

in a second stage, loading the signal of the second electrical level to the input signal end, loading the signal of the second electrical level to the first clock signal end, and loading the signal of the first electrical level to the second clock signal end;

in a third stage, loading the signal of the first electrical level to the input signal end, loading the signal of the first electrical level to the first clock signal end, and loading the signal of the second electrical level to the second clock signal end; and in a fourth stage, loading the signal of the first electrical level to the input signal end, loading the signal of the second electrical level to the first clock signal end, and loading the signal of the first electrical level to the second clock signal end.

8. A driving circuit, comprising a plurality of shifting registers, the shifting registers are cascaded, wherein an input signal end of a first level of the shifting registers is electrically connected with a trigger signal end; and in every two adjacent levels of the shifting registers, an input signal end of a next level of the shifting registers is electrically connected with an output signal end of a previous level of the shifting registers;

wherein each of the shifting registers comprises:

a control circuit, configured to adjust signals of a first node and a second node according to a signal of a first clock signal end, a signal of a second clock signal end and a signal of an input signal end;

a first output circuit, configured to provide a signal of a first reference signal end to an output signal end in response to the signal of the first node; and a first switching transistor, wherein a first end of the first switching transistor is electrically connected with the second node, a control end of the first switching transistor is electrically connected with a second reference signal end, and a second end of the first switching transistor is electrically connected with a second output circuit; and the second output circuit is configured to provide a signal of the second reference signal end to the output signal end under control of a signal of the second end of the first switching transistors;

wherein the control circuit comprises: an input circuit, a first node control circuit and a second node control circuit;

the input circuit is configured to provide the signal of the first reference signal end to a third node in response to the signal of the second clock signal end and the signal of the input signal end;

the first node control circuit is configured to adjust a signal of the third node according to the signal of the first clock signal end, provide the signal of the first clock signal end to the first node in response to the signal of the third node, and provide the signal of the first reference signal end to the first node in response to the signal of the second node; and the second node control circuit is configured to provide the signal of the input signal end to the second node in response to the signal of the first clock signal end.

9. A display device, comprising the driving circuit according to claim 8.

10. The driving circuit according to claim 8, wherein the input circuit comprises: a second switching transistor and a third switching transistor;

a first end of the second switching transistor is electrically connected with the first reference signal end, a control end of the second switching transistor is electrically connected with the input signal end, and a second end of the second switching transistor is electrically connected with the third node; and a first end of the third switching transistor is electrically connected with the first reference signal end, a control end of the third switching transistor is electrically connected with the second clock signal end, a second end of the third switching transistor is electrically connected with the third node.

11. The driving circuit according to claim 8, wherein the first node control circuit comprises: a fourth switching transistor, a fifth switching transistor and a first capacitor;

a first end of the fourth switching transistor is electrically connected with the first clock signal end, a control end of the fourth switching transistor is electrically connected with the third node, and a second end of the fourth switching transistor is electrically connected with the first node;

a first end of the fifth switching transistor is electrically connected with the first reference signal end, a control end of the fifth switching transistor is electrically connected with the second node d, and a second end of the fifth switching transistor is electrically connected with the first node; and a first end of the first capacitor is electrically connected with the first clock signal end, and a second end of the first capacitor is electrically connected with the third node.

12. The driving circuit according to claim 8, wherein the second node control circuit comprises: a sixth switching transistor; and a first end of the sixth switching transistor is electrically connected with the input signal end, a control end of the sixth switching transistor is electrically connected with the first clock signal end, and a second end of the sixth switching transistor is electrically connected with the second node.

13. The driving circuit according to claim 8, wherein the first output circuit comprises: a seventh switching transistor and a second capacitor;

a first end of the seventh switching transistor is electrically connected with the first reference signal end, a control end of the seventh switching transistor is electrically connected with the first node, and a second end of the seventh switching transistor is electrically connected with the output signal end; and a first end of the second capacitor is electrically connected with the first node, and a second end of the second capacitor is electrically connected with the first reference signal end.

14. The driving circuit according to claim 8, wherein the second output circuit comprises: an eighth switching transistor and a third capacitor;

a first end of the eighth switching transistor is electrically connected with the second reference signal end, a control end of the eighth switching transistor is electrically connected with the second end of the first switching transistor, and a second end of the eighth switching transistor is electrically connected with the output signal end; and a first end of the third capacitor is electrically connected with the second end of the first switching transistor, and the second end of the third transistor is electrically connected with the output signal end.

* * * * *